(12) United States Patent
Ishikawa et al.

(10) Patent No.: US 10,555,447 B2
(45) Date of Patent: Feb. 4, 2020

(54) COMPONENT SUPPLY DEVICE THAT SUPPLIES COMPONENTS FROM A SCATTERED STATE AND MOUNTING MACHINE THAT MOUNTS THE COMPONENT

(71) Applicant: FUJI CORPORATION, Chiryu-shi (JP)

(72) Inventors: Kazuma Ishikawa, Chiryu (JP); Shunji Morikawa, Toyoake (JP); Toru Matsumoto, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 55 days.

(21) Appl. No.: 15/552,394

(22) PCT Filed: Feb. 26, 2015

(86) PCT No.: PCT/JP2015/055526
§ 371 (c)(1),
(2) Date: Aug. 21, 2017

(87) PCT Pub. No.: WO2016/135909
PCT Pub. Date: Sep. 1, 2016

(65) Prior Publication Data
US 2018/0249606 A1 Aug. 30, 2018

(51) Int. Cl.
*H05K 13/02* (2006.01)
*B25J 11/00* (2006.01)
(Continued)

(52) U.S. Cl.
CPC ........... *H05K 13/028* (2013.01); *B25J 11/00* (2013.01); *H05K 13/0408* (2013.01); *B25J 15/0616* (2013.01)

(58) Field of Classification Search
CPC ....... B25J 11/00; B25J 15/0616; H05K 13/02; H05K 13/028; H05K 13/0408; H05K 13/0434
See application file for complete search history.

(56) References Cited

U.S. PATENT DOCUMENTS 5,314,055 A * 5/1994 Gordon .................. B25J 9/1697
198/395
5,687,831 A * 11/1997 Carlisle ................... A61F 11/12
198/395
(Continued)

FOREIGN PATENT DOCUMENTS

JP 6-82041 U 11/1994
JP 6-342995 A 12/1994
(Continued)

OTHER PUBLICATIONS

Extended European Search Report dated Sep. 27, 2018 in Patent Application No. 15883203.0, 8 pages.
(Continued)

*Primary Examiner* — Minh N Trinh
(74) *Attorney, Agent, or Firm* — Oblon, McClelland, Maier & Neustadt, L.L.P.

(57) ABSTRACT

A component supply device including a component support which supports multiple components in a scattered state; a first component holding tool which holds a component of the multiple components which is supported by the component support; a first moving device which includes a motor an which moves the first component holding tool; and a placement section on which the components are placed in a lined up state by the first component holding tool moved by the first moving device. The placement section includes a first recessed section corresponding to a shape of the components, and a second recessed section which having a same shape as the first recessed section rotated by a predetermined (Continued)

angle and which overlaps a portion of the first recessed section. The first component holding tool places the components in both the first recessed section and the second recessed section.

4 Claims, 17 Drawing Sheets

(51) Int. Cl.
  *H05K 13/04* (2006.01)
  *B25J 15/06* (2006.01)

(56) References Cited

U.S. PATENT DOCUMENTS

| | | | |
|---|---|---|---|
| 9,949,417 B2* | 4/2018 | Morikawa | B23P 19/001 |
| 10,233,030 B2* | 3/2019 | Matsumoto | B65G 47/14 |
| 2018/0249606 A1* | 8/2018 | Ishikawa | H05K 13/02 |
| 2019/0098806 A1* | 3/2019 | Iwaki | H05K 13/02 |

FOREIGN PATENT DOCUMENTS

| | | |
|---|---|---|
| JP | 2010-6590 A | 1/2010 |
| JP | 2012-245602 A | 12/2012 |

OTHER PUBLICATIONS

International Search Report dated May 26, 2015 in PCT/JP2015/055526 filed Feb. 26, 2015.

* cited by examiner

COMPONENT SUPPLY DEVICE THAT SUPPLIES COMPONENTS FROM A SCATTERED STATE AND MOUNTING MACHINE THAT MOUNTS THE COMPONENT

TECHNICAL FIELD

The present application relates to a component supply device which includes a component support section which supports multiple components in a scattered state and to a mounting machine which is provided with the component supply device.

BACKGROUND ART

In a component supply device which includes a component support section which supports multiple components in a scattered state, the supplying of the components is performed by the components which are supported by the component support section being held and lined up in a predetermined posture by a component holding tool. Therefore, it is necessary to recognize the postures of the components which are held by the component holding tool and to place the components in the predetermined postures. The patent literature below describes technology in which the postures of the components which are held by the component holding tool are recognized and the components are placed in the predetermined postures.
PTL 1: JP-A-H6-342995
PTL 2: JP-A-2012-245602

SUMMARY

According to the technology described in the patent literature, it is possible to recognize the postures of the components which are held by the component holding tool and to place the components in the predetermined postures. However, since multiple components are scattered in various postures on the component support section, there is a concern that it is not possible to place the components on a placement section depending on the postures of the components. The present disclosure is made in consideration of the issues described above and aims to place components of various postures on the placement section.

Solution to Problem

In order to solve the issues which are described above, a component supply device according to the present disclosure includes a component support section which supports multiple components in a scattered state, a first component holding tool which holds a component which is supported by the component support section, a first moving device which causes the first component holding tool to move to a given position, and a placement section on which the components which are held by the first component holding tool are placed in a lined up state, in which the component supply device supplies the components in the state of being lined up on the placement section, in which the placement section includes a first recessed section corresponding to the shape of the components, and a second recessed section which is formed in a state in which a recessed section of the same shape as the first recessed section is rotated by a predetermined angle and overlaps a portion of the first recessed section, and in which it is possible to place the components which are held by the first component holding tool in either the first recessed section or the second recessed section.

In order to solve the issues which are described above, a mounting machine according to the present disclosure includes the component supply device, a first control device which controls operations of the first component holding tool and the first moving device of the component supply device, a second component holding tool which holds a component which is placed on the placement section of the component supply device, a second moving device which causes the second component holding tool to move to a given position, and a second control device which controls the operations of the second component holding tool and the second moving device, in which the mounting machine uses the second component holding tool to hold a component which is placed on the placement section of the component supply device and mounts the component which is held by the second component holding tool on a board, and in which the first control device includes a first operation control section which controls the operations of the first component holding tool and the first moving device to place the component which is held by the first component holding tool in either one of the first recessed section and the second recessed section of the placement section, and a notification section which notifies the second control device of information indicating which of the first recessed section and the second recessed section of the placement section in which the component which is held by the first component holding tool is placed through the control of the first operation control section.

Advantageous Effects

In the component supply device described in the present disclosure, a first recessed section corresponding to the shape of a component and a second recessed section that is the same shape as the first recessed section, rotated by a predetermined angle, and overlapping a portion of the first recessed section are formed in a placement section. Therefore, it is possible to place the component which is held by a component holding tool in both the first recessed section and the second recessed section. Accordingly, it is possible to place components of various postures on the placement section. In a mounting machine of the present disclosure, a control device of the mounting machine side is notified of information indicating the postures of the components which are placed on the placement section, that is, information indicating in which of the first recessed section and the second recessed section the components are placed. Accordingly, the component holding tool of the mounting machine side is capable of appropriately holding a component from the placement section based on the information indicating the postures of the components which are placed on the placement section.

DESCRIPTION OF EMBODIMENTS

Hereinafter, a detailed description will be given of an embodiment of the present disclosure with reference to the drawings.

Configuration of Component Mounting Machine

Figure 1:
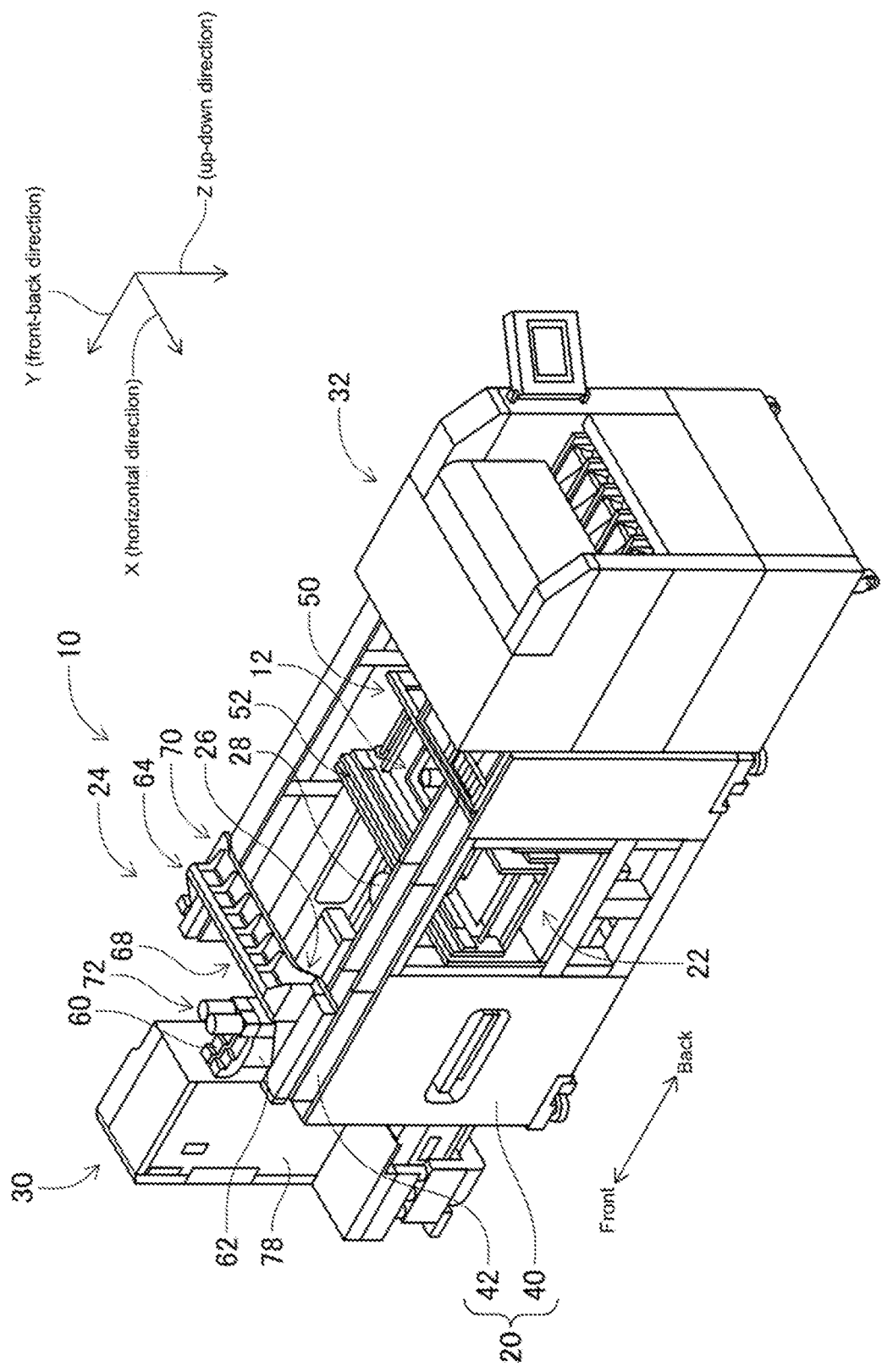
FIG. 1 is a perspective view illustrating a component mounting machine.

FIG. 1 illustrates component mounting machine 10. Component mounting machine 10 is a device for performing work of mounting components onto circuit substrate 12. Component mounting machine 10 is provided with device main body 20, substrate conveyance and holding device 22, component mounting device 24, imaging devices 26 and 28, component supply device 30, bulk component supply device 32, and control device (refer to FIG. 8) 34. Examples of circuit substrate 12 include a circuit board and a three-dimensional structure substrate, and examples of the circuit board include a printed wiring board and a printed circuit board.

Device main body 20 is configured by frame section 40 and beam section 42 which bridges over frame section 40. Substrate conveyance and holding device 22 is installed in the middle of the front-back direction of frame section 40 and includes conveyance device 50 and clamping device 52. Conveyance device 50 is a device which conveys circuit substrate 12, and clamping device 52 is a device which holds circuit substrate 12. Accordingly, substrate conveyance and holding device 22 conveys circuit substrate 12 and holds circuit substrate 12 in a fixed manner at a predetermined position. In the following description, the conveyance direction of circuit substrate 12 will be referred to as an X-direction, a horizontal direction which is perpendicular to the conveyance direction will be referred to as a Y-direction, and the vertical direction will be referred to as a Z-direction. In other words, the width direction of component mounting machine 10 is the X-direction and the front-back direction is the Y-direction.

Figure 2:
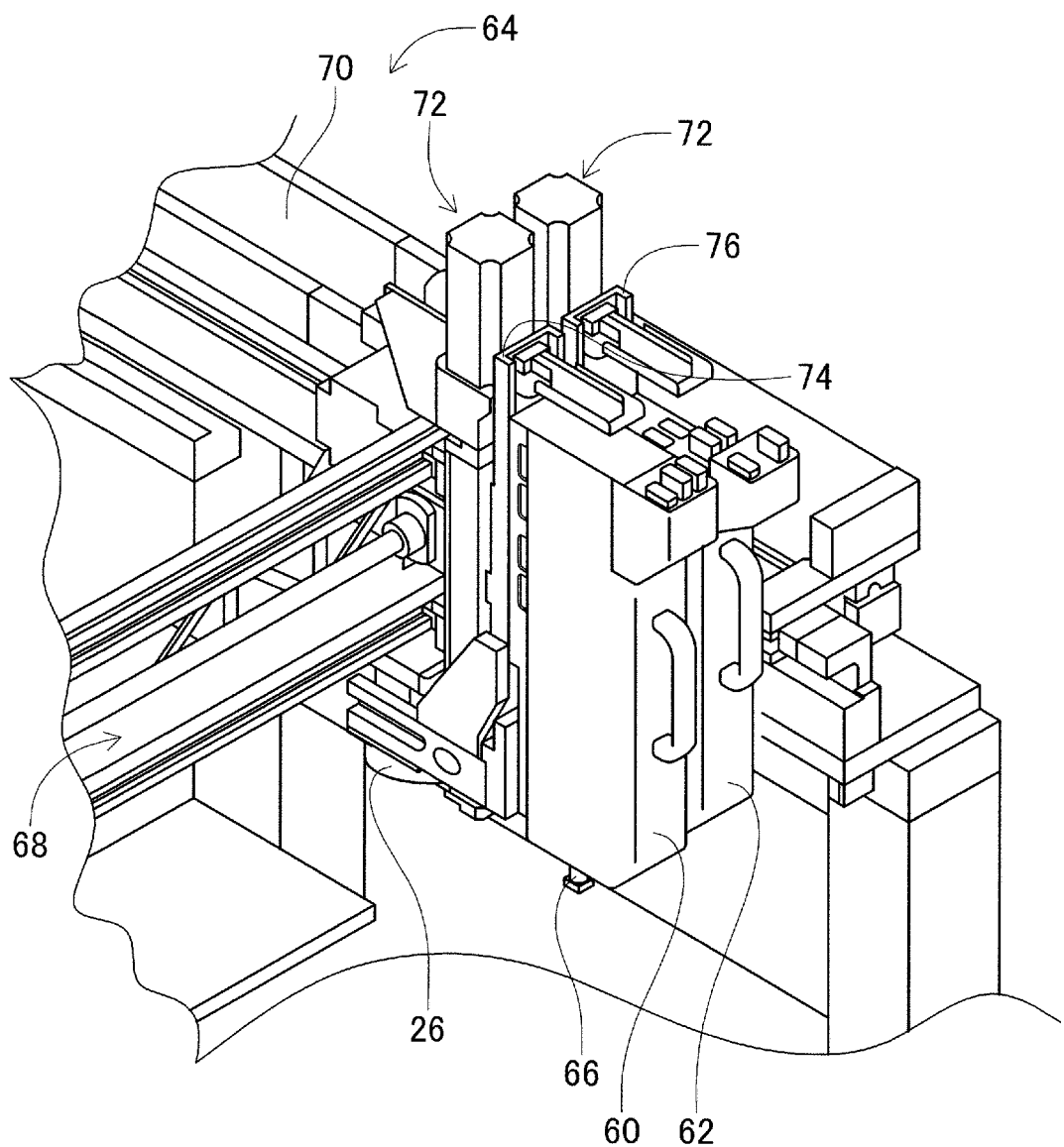
FIG. 2 is a perspective view illustrating a component mounting device of the component mounting machine.

Component mounting device 24 is installed on beam section 42 and includes two work heads 60 and 62 and work head moving device 64. Each of the work heads 60 and 62 includes suction nozzle (refer to FIG. 2) 66 and holds a component using suction nozzle 66. Work head moving device 64 includes X-direction moving device 68, Y-direction moving device 70, and Z-direction moving device 72. The two work heads 60 and 62 are caused to move integrally to a given position on frame section 40 by X-direction moving device 68 and Y-direction moving device 70. As illustrated in FIG. 2, work heads 60 and 62 are mounted to be attachable and detachable with respect to sliders 74 and 76, respectively, and Z-direction moving device 72 causes sliders 74 and 76 to move individually in the up-down direction. In other words, work heads 60 and 62 are caused to move individually in the up-down direction by Z-direction moving device 72.

Imaging device 26 is attached to slider 74 in a state facing downward and is caused to move in the X-direction, the Y-direction, and the Z-direction together with work head 60. Accordingly, imaging device 26 images a given position on frame section 40. As illustrated in FIG. 1, imaging device 28 is arranged between substrate conveyance and holding device 22 and component supply device 30 on frame section 40 in a state facing upward. Accordingly, imaging device 28 images the components which are held by suction nozzles 66 of work heads 60 and 62.

Component supply device 30 is arranged on an end portion of one side in the front-back direction of frame section 40. Component supply device 30 includes tray-type component supply device 78 and a feeder-type component supply device (not illustrated). Tray-type component supply device 78 is a device which supplies components which are placed on a tray. The feeder-type component supply device is a device which supplies components using a tape feeder (not illustrated) or a stick feeder (not illustrated).

Bulk component supply device 32 is arranged on an end portion of the other side in the front-back direction of frame section 40. Bulk component supply device 32 is a device which lines up multiple components in a state of being scattered loosely and supplies the components in a lined up state. In other words, a device which lines up multiple components which are in random postures into predetermined postures and supplies the components in the predetermined postures. Hereinafter, a detailed description will be given of the configuration of bulk component supply device 32. Examples of components which are supplied by component supply device 30 and bulk component supply device 32 include electronic circuit components, constituent components of a solar cell, and constituent components of a power module. Among the electronic circuit components, there are components which include leads, components which do not include leads, and the like.

Figure 3:
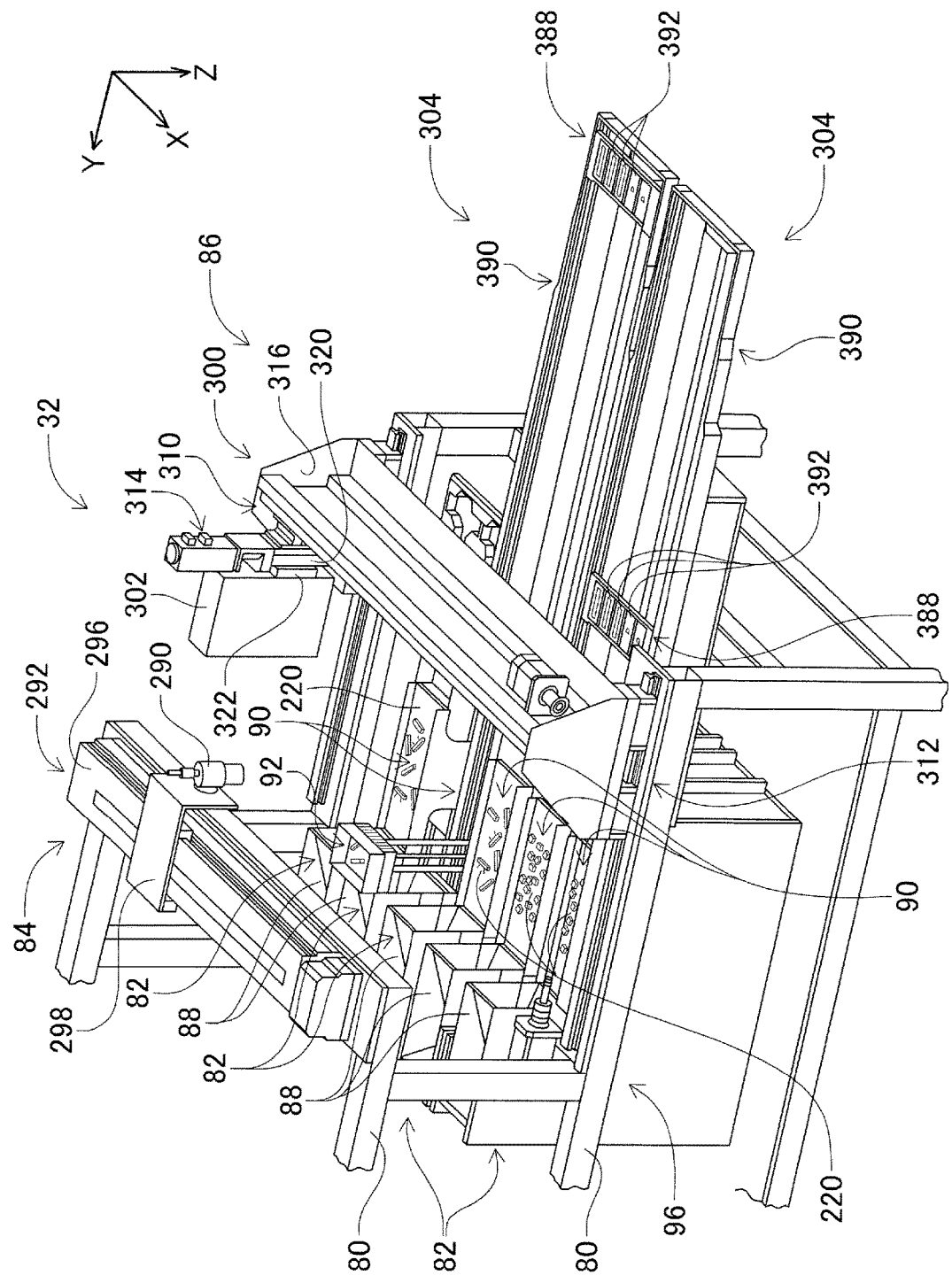
FIG. 3 is a perspective view illustrating a bulk component supply device.

As illustrated in FIG. 3, bulk component supply device 32 includes main body 80, component supply unit 82, imaging device 84, and component delivery device 86.

(a) Component Supply Unit

Component supply unit 82 includes component feeder 88, component scattering device 90, and component return device 92, and component feeder 88, component scattering device 90, and component return device 92 are configured integrally. Component supply unit 82 is attached to base 96 of main body 80 to be attachable and detachable, and five of the component supply units 82 are arranged to line up in one row in the X-direction in bulk component supply device 32.

(i) Component Feeder

Figure 4:
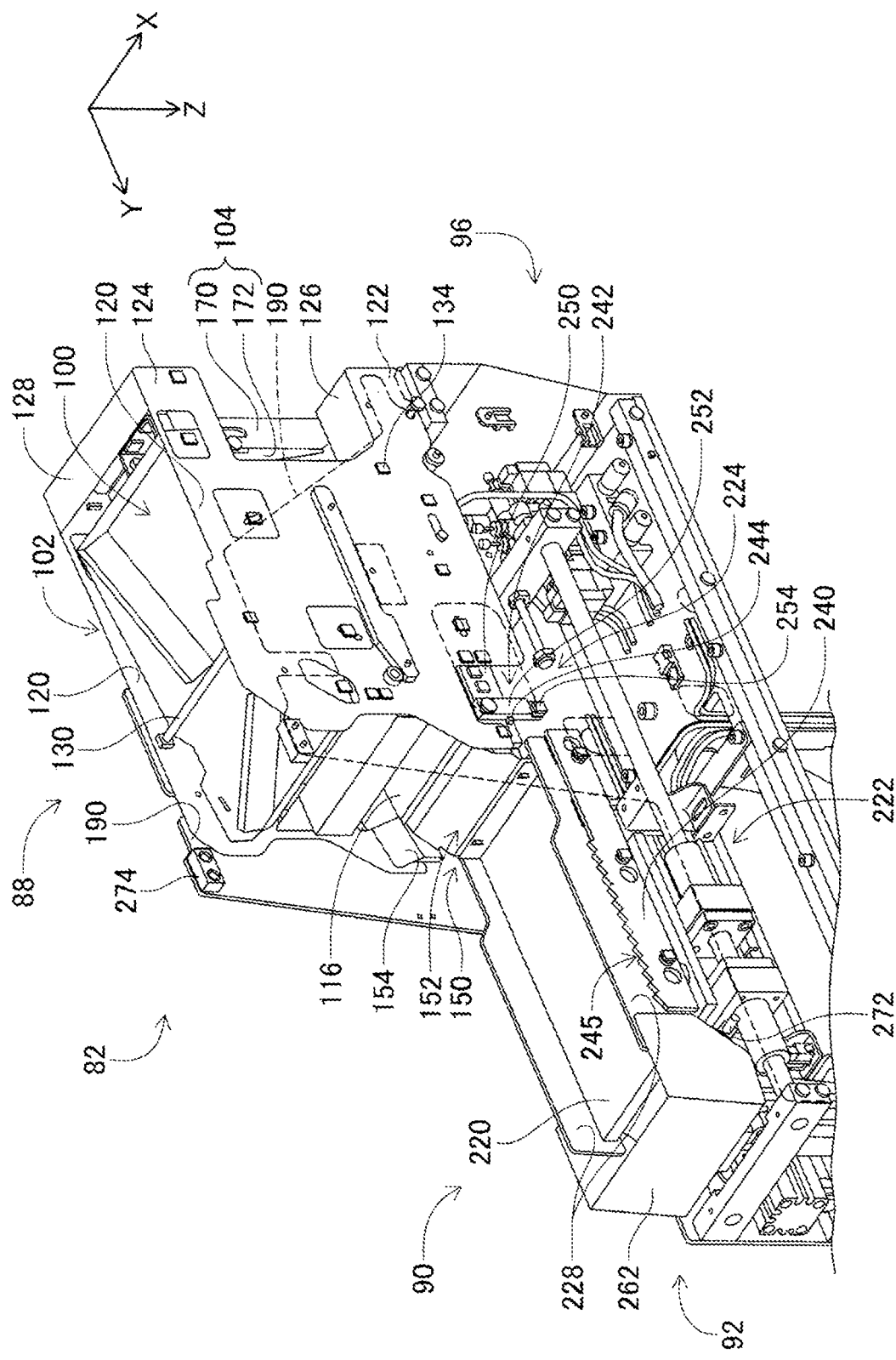
FIG. 4 is a perspective view illustrating a component supply unit.

As illustrated in FIG. 4, component feeder 88 includes component storage device 100, housing 102, and grip 104. Component storage device 100 is substantially a rectangular parallelepiped shape, and the upper face and the front face are opened. The bottom face of component storage device 100 is inclined surface 116 and is inclined toward the open front face of component storage device 100.

Housing 102 includes a pair of side walls 120, and component storage device 100 is held to be capable of rocking between the pair of side walls 120. Inclined plate 152 is arranged, in a fixed manner, between the pair of side walls 120 so as to be positioned in front of the lower end portion of the front face of component storage device 100. Inclined plate 152 is inclined so as to lower toward the front.

Grip 104 is arranged on the end portion of the rear side of the housing 102 and is configured by fixed gripping member 170 and movable gripping member 172. Movable gripping member 172 is capable of approaching and separating with respect to fixed gripping member 170. Movable gripping member 172 is connected to the rear face of component storage device 100 by a connecting arm (not illustrated). Accordingly, due to grip 104 being gripped, movable gripping member 172 approaches and separates with respect to fixed gripping member 170, and component storage device 100 rocks between the pair of side walls 120.

Component feeder 88 is arranged between a pair of side frame sections 190 which are attached to base 96 and is attachable and detachable with respect to base 96. A lock mechanism (not illustrated) is provided on the lower end portion of movable gripping member 172 of grip 104, and the lock mechanism is released by grip 104 being gripped. In other words, due to the operator lifting component feeder 88 in a state in which the operator is gripping grip 104 of the component feeder 88, component feeder 88 is removed from between the pair of side frame sections 190.

(ii) Component Scattering Device

Component scattering device 90 includes component support member 220, component support member moving device 222, and feeder vibration device 224. Component support member 220 is substantially in the form of a longitudinal plate and is arranged so as to extend forward from under inclined plate 152 of component feeder 88. Side wall sections 228 are formed on both side edges of component support member 220 in the longitudinal direction.

Component support member moving device 222 causes component support member 220 to move in the front-back direction through the driving of electromagnetic motor (refer to FIG. 8) 223. Accordingly, component support member 220 moves in the front-back direction in a state in which the upper face of component support member 220 is horizontal, slightly below the lower end of inclined plate 152 of component feeder 88.

Feeder vibration device 224 includes cam member 240, cam follower 242, and stopper 244. Cam member 240 is plate-shaped and is fixed to the side face of the outside of side wall section 228 so as to extend in the front-back direction. Multiple teeth 245 are formed at an equal interval in the front-back direction on the upper end portion of cam member 240. Cam follower 242 includes lever 252 and roller 254. Lever 252 is arranged on the lower end portion of side wall 120 of component feeder 88 and is capable of rocking around the upper end portion. Roller 254 is held to be capable of rotating on the lower end portion of lever 252. Lever 252 is biased in a direction toward the front by an elastic force of a coil spring (not illustrated). Stopper 244 is provided as a form which protrudes from side wall 120, and lever 252 which is biased by the elastic force of the coil spring is in contact with stopper 244.

(iii) Component Return Device

Figure 5:
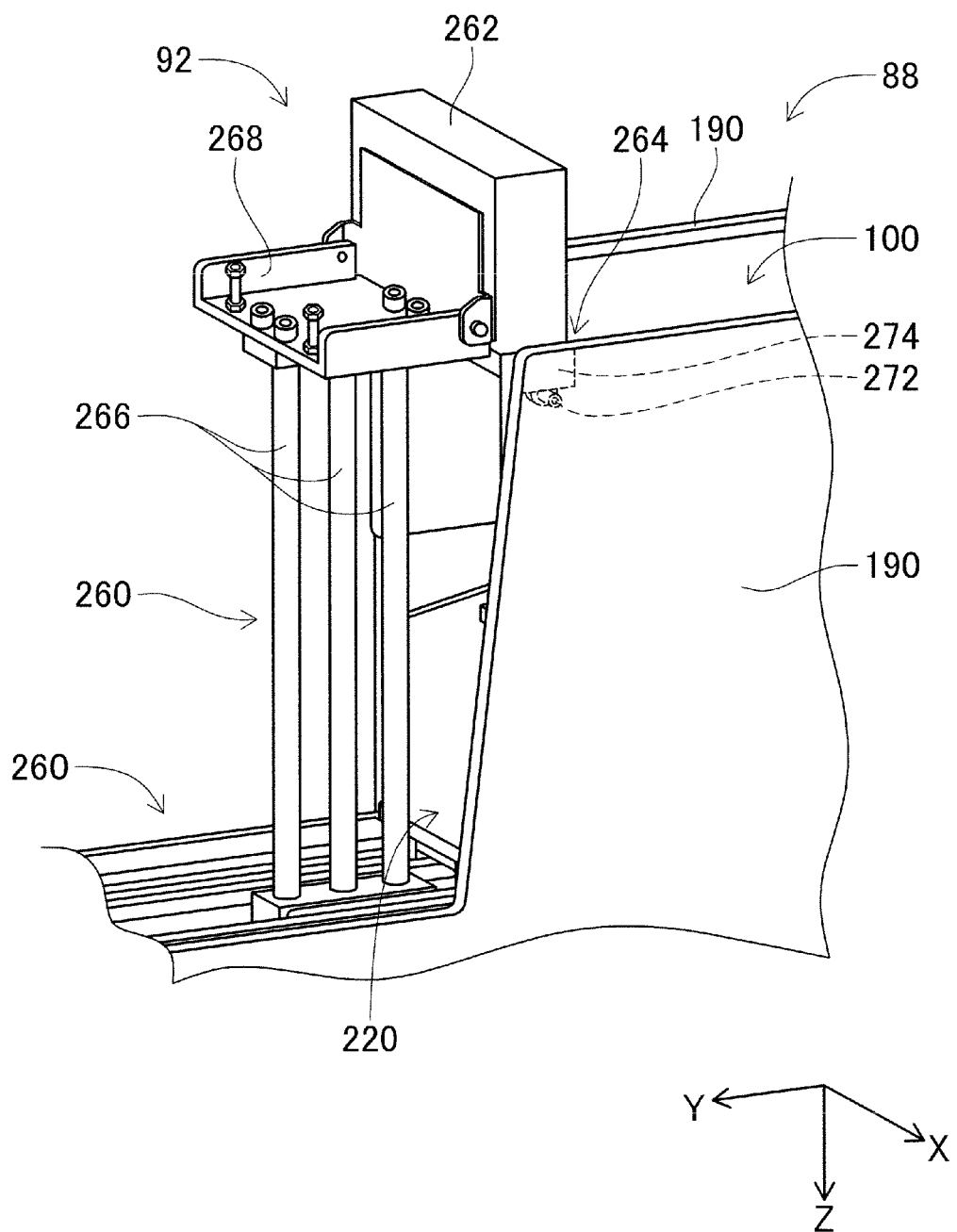
FIG. 5 is a perspective view illustrating the component supply unit in a state in which a component collecting container is lifted to a lifting end position.

As illustrated in FIG. 5, component return device 92 includes container lifting and lowering device 260 and component collecting container 262. Container lifting and lowering device 260 includes air cylinder 266 and lifting and lowering member 268, and lifting and lowering member 268 performs lifting and lowering through the operation of air cylinder 266. Air cylinder 266 is fixed to the end portion of the front side of component support member 220. Accordingly, air cylinder 266 moves in the front-back direction together with component support member 220 through the operation of component support member moving device 222.

Component collecting container 262 is arranged on the upper face of lifting and lowering member 268 and moves in the up-down direction through the operation of air cylinder 266. Component collecting container 262 has a box-like shape with an opened upper face and is held to be capable of rotating on the upper face of lifting and lowering member 268. As illustrated in FIG. 4, protruding pin 272 is arranged on the end portion of the rear side of component collecting container 262. Protruding pin 272 protrudes toward the outside on the side of component collecting container 262. Engaging block 274 is fixed to the inside of the upper end portion of the front side of side frame section 190. As illustrated in FIG. 5, protruding pin 272 engages with engaging block 274 when component collecting container 262 is lifted to the lifting end position through the operation of air cylinder 266. Accordingly, component collecting container 262 rotates.

(b) Imaging Device

As illustrated in FIG. 3, imaging device 84 includes camera 290 and camera moving device 292. Camera moving device 292 includes guide rail 296 and slider 298. Guide rail 296 is fixed to main body 80 so as to extend in the width direction of bulk component supply device 32 above component feeder 88. Slider 298 is attached to be capable of sliding along guide rail 296 and slides to a given position through the operation of electromagnetic motor (refer to FIG. 8) 299. Camera 290 is mounted to slider 298 in a state facing downward.

(c) Component Delivery Device

As illustrated in FIG. 3, component delivery device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 which is arranged above component supply unit 82 to extend in the X-direction, and Y slider 316 moves to a given position in the Y-direction through the driving of electromagnetic motor 319 (refer to FIG. 8). X-direction moving device 310 includes X slider 320 which is arranged on the side face of Y slider 316, and X slider 320 moves to a given position in the X-direction through the driving of electromagnetic motor (refer to FIG. 8) 321. Z-direction moving device 314 includes Z slider 322 which is arranged on the side face of X slider 320, and Z slider 322 moves to a given position in the Z-direction through the driving of electromagnetic motor (refer to FIG. 8) 323.

Figure 6:
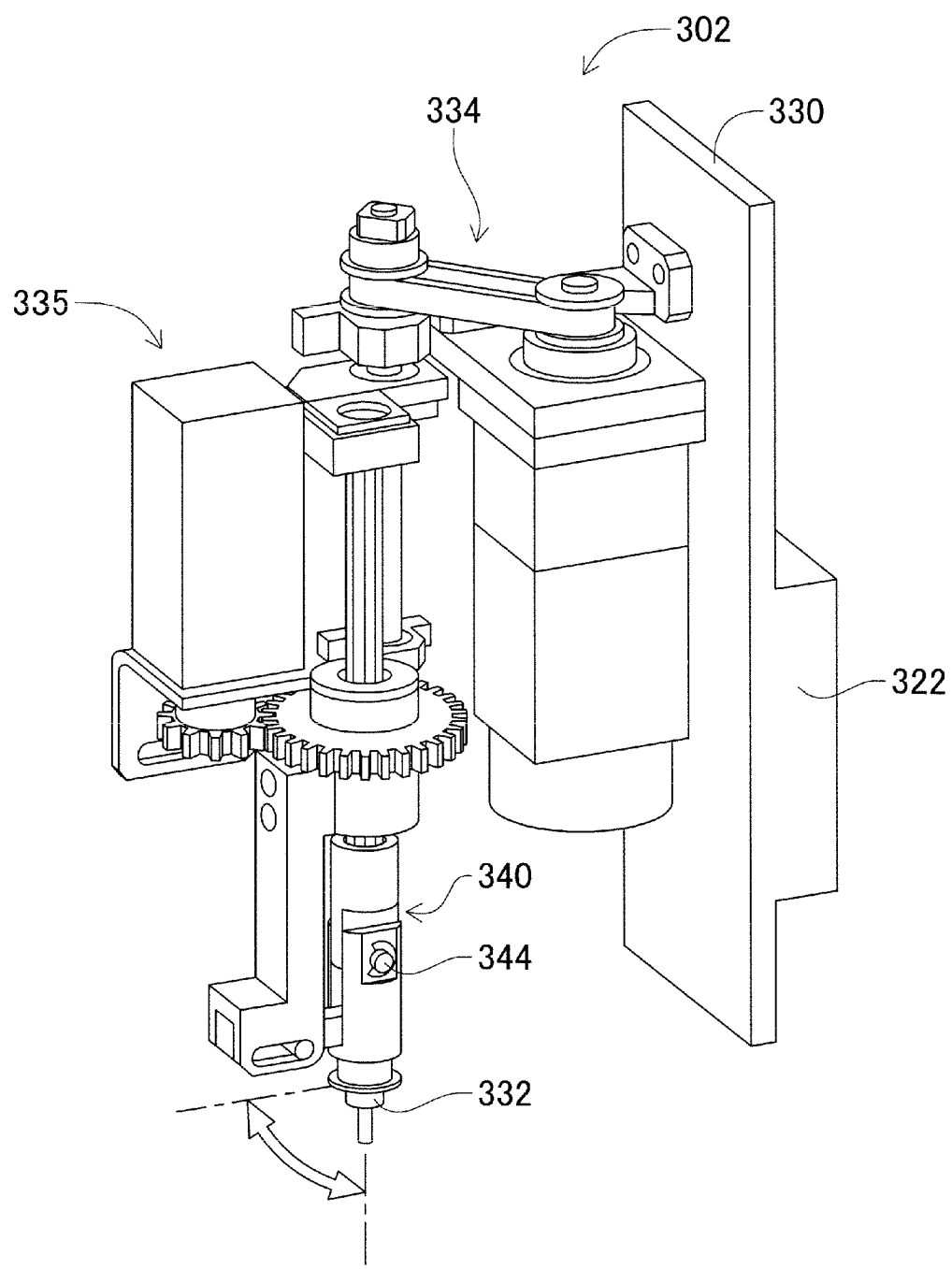
FIG. 6 is a perspective view illustrating a component holding head.

As illustrated in FIG. 6, component holding head 302 includes head main body 330, suction nozzle 332, nozzle pivoting device 334, and nozzle rotation device 335. Head main body 330 is formed integrally with Z slider 322. Suction nozzle 332 holds a component and is mounted to be attachable and detachable with respect to the lower end portion of holder 340. Holder 340 capable of bending at support shaft 344 and holder 340 bends in the up direction by 90° through the operation of nozzle pivoting device 334. Accordingly, suction nozzle 332 which is mounted to the lower end portion of holder 340 pivots by 90° and is positioned at a pivoting position. In other words, suction nozzle 332 pivots between the non-pivoting position and the pivoting position through the operation of nozzle pivoting device 334. Nozzle rotation device 335 causes suction nozzle 332 to rotate around the axis of suction nozzle 332.

As illustrated in FIG. 3, each of the two shuttle devices 304 includes component carrier 388 and component carrier moving device 390, and shuttle devices 304 are fixed to main body 80 lined up in the horizontal direction on the front side of component supply unit 82. Five component receiving members 392 are mounted to component carrier 388 in a state lined up in a single row in the horizontal direction, and the components are placed on each of the component receiving members 392.

Figure 7:
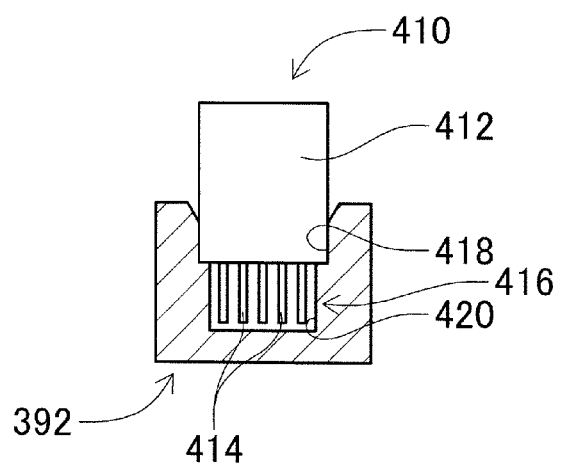
FIG. 7 is a diagram illustrating a component receiving member in a state in which leaded components are stored.

Specifically, as illustrated in FIG. 7, component which are supplied by bulk component supply device 32 are electronic circuit components (hereinafter may be abbreviated to "leaded component") 410 which include leads, and leaded component 410 is configured by block-shaped component main body 412 and multiple leads 414 which protrude from the bottom face of component main body 412. Component receiving recessed section 416 is formed in component receiving member 392. Component receiving recessed section 416 is a step-shaped recessed section, and is configured by component main body receiving recessed section 418 which is open to the upper face of component receiving member 392, and lead receiving recessed section 420 which is open to the bottom face of component main body receiving recessed section 418. Leaded component 410 is inserted into the inner portion of component receiving recessed section 416 in a posture in which leads 414 face downward. Accordingly, leads 414 are inserted into lead receiving recessed section 420 and leaded component 410 is placed in the inner portion of component receiving recessed section 416 in a state in which component main body 412 is inserted into component main body receiving recessed section 418.

As illustrated in FIG. 3, component carrier moving device 390 is a plate-shaped longitudinal member, and is arranged on the front side of component supply unit 82 to extend in the front-back direction. Component carrier 388 is arranged on the upper face of component carrier moving device 390 to be capable of sliding in the front-back direction and slides to a given position in the front-back direction through the driving of electromagnetic motor (refer to FIG. 8) 430. When component carrier 388 slides in a direction approaching component supply unit 82, component carrier 388 slides to the component receiving position which is positioned within the movement range of component holding head 302 due to component holding head moving device 300. Meanwhile, when component carrier 388 slides in a direction separating from component supply unit 82, component carrier 388 slides to the component supply position which is positioned within the movement range of work heads 60 and 62 due to work head moving device 64.

Figure 8:
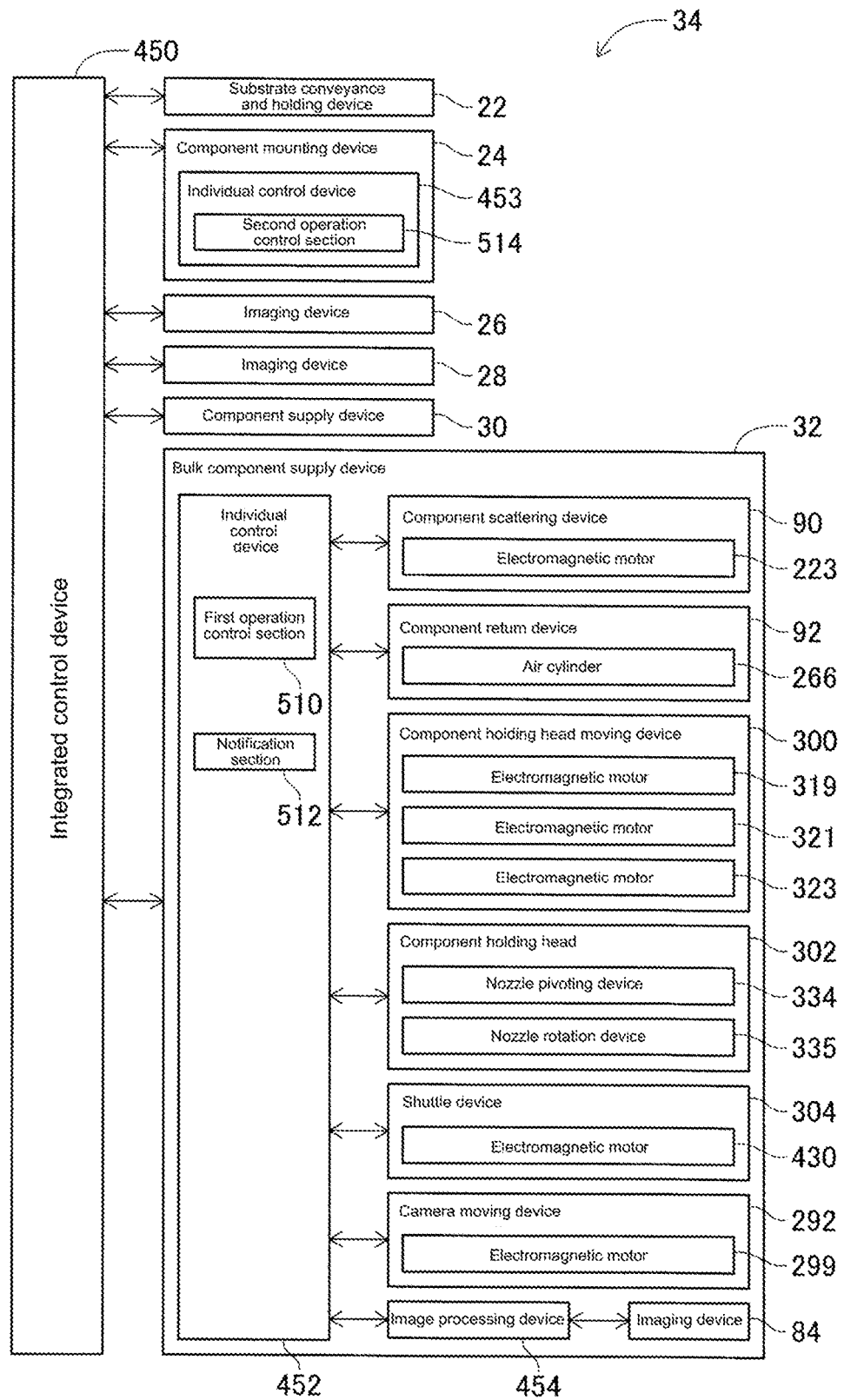
FIG. 8 is a block diagram illustrating a control device with which the component mounting machine is provided.

As illustrated in FIG. 8, control device 34 includes integrated control device 450, multiple individual control devices (two are illustrated in the drawing) 452 and 453, and image processing device 454. Integrated control device 450 is configured with a computer as the main constituent and is connected to substrate conveyance and holding device 22, component mounting device 24, imaging device 26, imaging device 28, component supply device 30, and bulk component supply device 32. Accordingly, integrated control device 450 performs integral control of substrate conveyance and holding device 22, component mounting device 24, imaging device 26, imaging device 28, component supply device 30, and bulk component supply device 32. The multiple individual control devices 452 and 453 are configured with a computer as the main constituent and are provided to correspond to substrate conveyance and holding device 22, component mounting device 24, imaging device 26, imaging device 28, component supply device 30, and bulk component supply device 32 (in the drawings, only the individual control devices 452 and 453 which correspond to component mounting device 24 and bulk component supply device 32 are depicted). Individual control device 452 of bulk component supply device 32 is connected to component scattering device 90, component return device 92, camera moving device 292, component holding head moving device 300, component holding head 302, and shuttle device 304. Accordingly, individual control device 452 of bulk component supply device 32 controls the operations of component scattering device 90, component return device 92, camera moving device 292, component holding head moving device 300, component holding head 302, and shuttle device 304. Image processing device 454 is connected to imaging device 84 and processes captured image data which is captured by imaging device 84. Image processing device 454 is connected to individual control device 452 of bulk component supply device 32. Accordingly, individual control device 452 of bulk component supply device 32 acquires the captured image data which is captured by imaging device 84. Individual control device 453 of component mounting device 24 is connected to work heads 60 and 62 and work head moving device 64 and controls operations of work heads 60 and 62 and work head moving device 64.

<Operations of Component Mounting Machine>

According to the configuration described above, work of mounting components onto circuit substrate 12 which is held by substrate conveyance and holding device 22 is performed in component mounting machine 10. Specifically, circuit substrate 12 is conveyed to a working position and is held at the position by clamping device 52 in a fixed manner. Next, imaging device 26 moves above circuit substrate 12 and images circuit substrate 12. Accordingly, information relating to an error of the holding position of circuit substrate 12 is obtained. Component supply device 30 or bulk component supply device 32 supplies components at a predetermined supply position. A detailed description relating to the supplying of components by bulk component supply device 32 will be given later. Either of the work heads 60 and 62 moves above the supply position of the component and holds the component using suction nozzle 66. Next, work head 60 or 62 which holds the component moves above imaging device 28, and the component which is held by suction nozzle 66 is imaged by imaging device 28. Accordingly, information relating to an error of the holding position of the component is obtained. Work head 60 or 62 which holds the component moves above circuit substrate 12, corrects the error of the holding position of circuit substrate 12, the error of the holding position of the component, and the like, and mounts the component which is held onto circuit substrate 12.

<Operations of Bulk Component Supply Device>
(a) Supply of Leaded Components by Bulk Component Supply Device In bulk component supply device 32, leaded components 410 are inserted into component storage device 100 of component feeder 88 by an operator and the inserted leaded components 410 are supplied in a state of being placed in component receiving members 392 of component carrier 388 through the operation of component supply unit 82 and component delivery device 86. Specifically, the operator inserts the leaded components 410 from the opening on the upper face of component storage device 100 of component feeder 88. At this time, component support member 220 moves to below component feeder 88 through the operation of component support member moving device 222, and component collecting container 262 is positioned in front of component feeder 88.

The leaded components 410 which are inserted from the opening in the upper face of component storage device 100 fall onto inclined surface 116 of component storage device 100 and spread out on inclined surface 116. At this time, in a case in which the leaded components 410 which fall onto inclined surface 116 exceed inclined plate 152 and roll off, the leaded components 410 are housed in component collecting container 262 which is positioned in front of component feeder 88.

Figure 9:
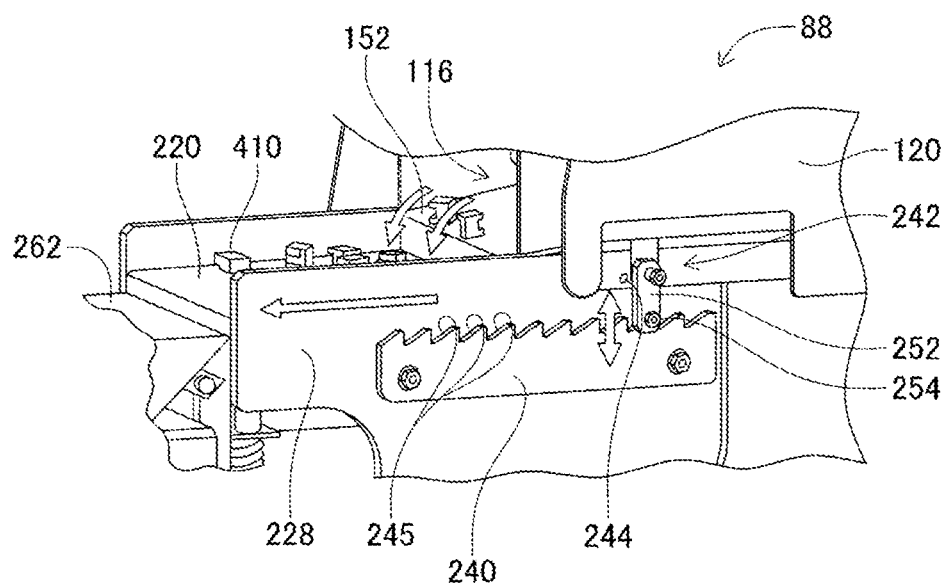
FIG. 9 is a perspective view illustrating a component scattering device.

After the insertion of the leaded components 410 to component storage device 100, component support member 220 is caused to move from under component feeder 88 toward the front through the operation of component support member moving device 222. At this time, when cam member 240 reaches cam follower 242, as illustrated in FIG. 9, roller 254 of cam follower 242 rolls over teeth 245 of cam member 240. Lever 252 of cam follower 242 is biased in a direction toward the front by the elastic force of a coil spring, and the biasing of lever 252 to the front is restricted by stopper 244. Therefore, when component support member 220 moves toward the front, component support member 220 is maintained in a state in which roller 254 meshes with teeth 245, lever 252 does not rotate toward the front, and roller 254 rolls over teeth 245. At this time, component feeder 88 is lifted due to roller 254 rolling over teeth 245. In other words, in a state in which roller 254 meshes with teeth 245, component support member 220 moves toward the front, whereby roller 254 rolls over multiple teeth 245 and component feeder 88 continuously vibrates in the up-down direction.

The leaded components 410 which are spread out on inclined surface 116 of component storage device 100 move to the front due to the vibration of component feeder 88 and the inclination of the inclined surface 116, and are discharged onto the upper face of component support member 220 via inclined plate 152. Here, the falling of the leaded components 410 from component support member 220 is prevented by side wall sections 228 of component support member 220. The leaded components 410 are scattered on the upper face of component support member 220 due to component support member 220 moving toward the front.

Figure 10:
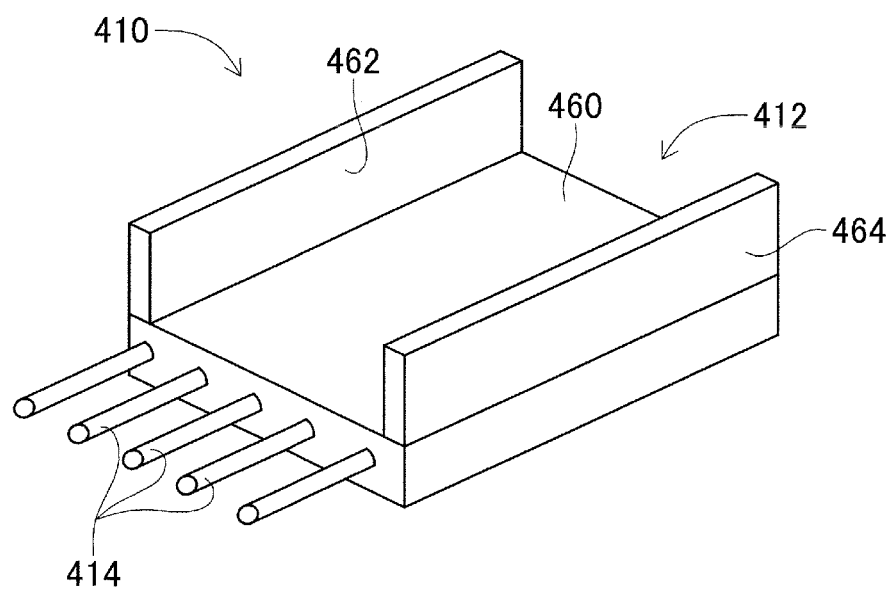
FIG. 10 is a perspective view illustrating leaded components.

When leaded components 410 are scattered on component support member 220 from the inner portion of component storage device 100, leaded components 410 are scattered on component support member 220 in various postures. Specifically, for example, for the leaded component 410 of the shape illustrated in FIG. 10, component main body 412 is configured by main body section 460 and a pair of side wall sections 462 and 464. Main body section 460 has a substantially rectangular plate shape and multiple leads 414 are arranged on the short side faces among the four side faces. The pair of side wall sections 462 and 464 are provided along both edges of the long sides of the upper face of main body section 460.

Figure 11:
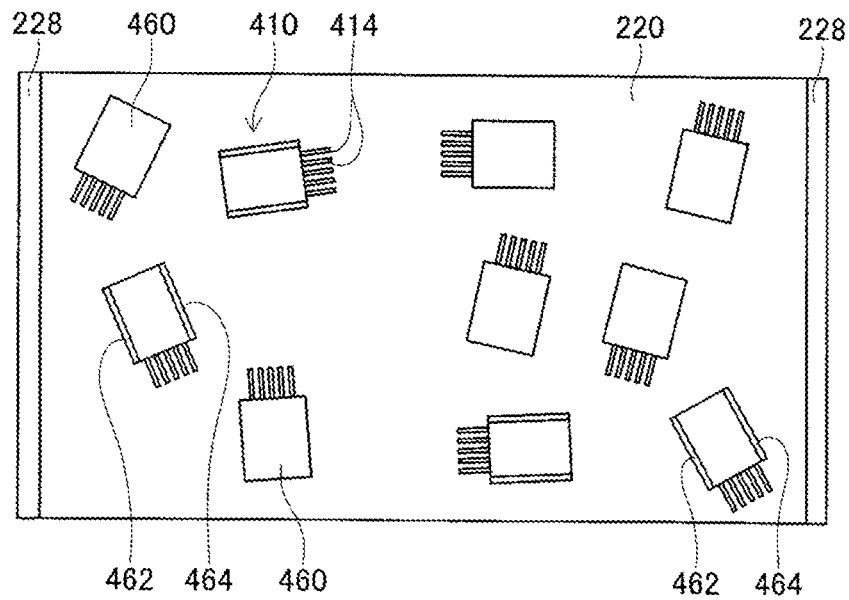
FIG. 11 is a diagram illustrating a component support member in a state in which multiple leaded components are scattered.

When leaded components 410 of this shape are scattered on component support member 220, the leaded components 410 are generally supported on component support member 220 in two postures, as illustrated in FIG. 11. Specifically, the leaded components 410 are supported on component support member 220 in one of two postures, a posture in which main body section 460 is in contact with component support member 220 and the pair of side wall sections 462 and 464 face upward (hereinafter, there are cases in which this is denoted as a "first posture"), and a posture in which the pair of side wall sections 462 and 464 are in contact with the component support member 220 and the main body section 460 faces upward (hereinafter, there are cases in which this is denoted as a "second posture").

There is also a case in which leaded components 410 are supported on component support member 220 in postures in which one of the pair of side wall sections 462 and 464 is caused to come into contact with the component support member 220 and the other faces upward; however, since the probability that leaded components 410 are supported in this posture is low, in the present description, leaded components 410 of such a posture are omitted.

As described above, when leaded components 410 are scattered on component support member 220, camera 290 of imaging device 84 moves above component support member 220 through the operation of camera moving device 292 and images the leaded components 410. A leaded component which serves as a pickup target (hereinafter, there is a case in which this is abbreviated to a "pickup target component") is specified based on the captured image data which is captured by camera 290, and the pickup target component is held by suction nozzle 332 of component holding head 302. When the pickup target component is picked up and held by suction nozzle 332, the suction nozzle 332 is positioned at the non-pivoting position.

After the leaded component 410 is held by suction nozzle 332, component holding head 302 is caused to move above component carrier 388, and, at this time, component carrier 388 moves to the component receiving position through the operation of component carrier moving device 390. When component holding head 302 moves above component carrier 388, suction nozzle 332 is pivoted to the pivoting position. Suction nozzle 332 is rotated through the operation of nozzle rotation device 335 such that the leads 414 of the leaded component 410 which is held by suction nozzle 332 in the pivoting position face downward in the vertical direction.

When component holding head 302 moves above component carrier 388, the leaded component 410 which is in a state in which leads 414 face downward in the vertical direction is inserted into component receiving recessed section 416 of component receiving member 392. Accordingly, as illustrated in FIG. 7, the leaded component 410 is placed in component receiving member 392 in a state in which leads 414 face downward in the vertical direction.

However, in a case in which component receiving recessed section 416 of component receiving member 392 is the shape of the related art, there is a case in which although the leaded components 410 of the first posture are pickup target components, the leaded components 410 of the second posture are not pickup target components. In other words, there is a case in which only the leaded components 410 of the first posture are transferred from component support member 220 to component receiving member 392 and the leaded components 410 of the second posture remain on component support member 220.

Figure 12:
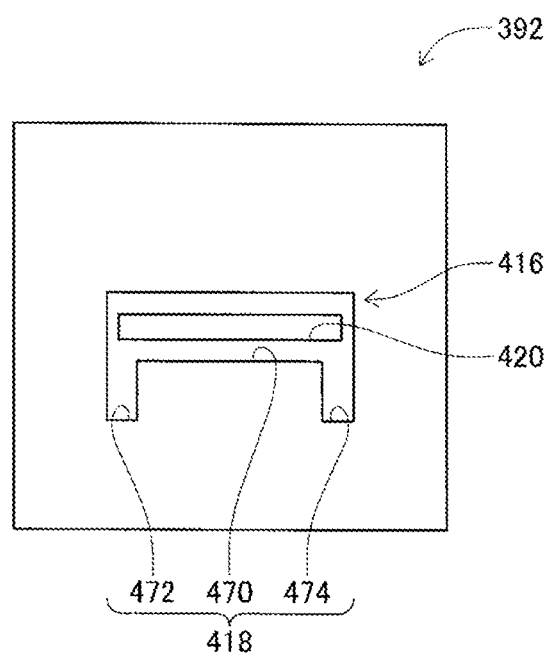
FIG. 12 is a plan view illustrating a component receiving member of the related art.

Specifically, as illustrated in FIG. 12, in component receiving member 392 of the related art, component main body receiving recessed section 418 of component receiving recessed section 416 is configured from main body section receiving recessed section 470 and a pair of side wall section receiving recessed sections 472 and 474. FIG. 12 is a diagram illustrating component receiving member 392 from above. Main body section receiving recessed section 470 is a shape corresponding to main body section 460 of component main body 412 of the leaded component 410. The pair of side wall section receiving recessed sections 472 and 474 are shapes corresponding to the pair of side wall sections 462 and 464 of component main body 412 of the leaded component 410 and protrude in the same direction from both end portions of main body section receiving recessed section 470 to intersect with main body section receiving recessed section 470 at 90°. Main body section 460 of component main body 412 of the leaded component 410 is inserted into main body section receiving recessed section 470 and the pair of side wall sections 462 and 464 of component main body 412 of the leaded component 410 are inserted into the pair of side wall section receiving recessed sections 472 and 474 such that component main body 412 of the leaded component 410 is placed inside component main body receiving recessed section 418. When component main body 412 of the leaded component 410 is placed inside component main body receiving recessed section 418, leads 414 are naturally inserted into lead receiving recessed section 420.

Figure 13:
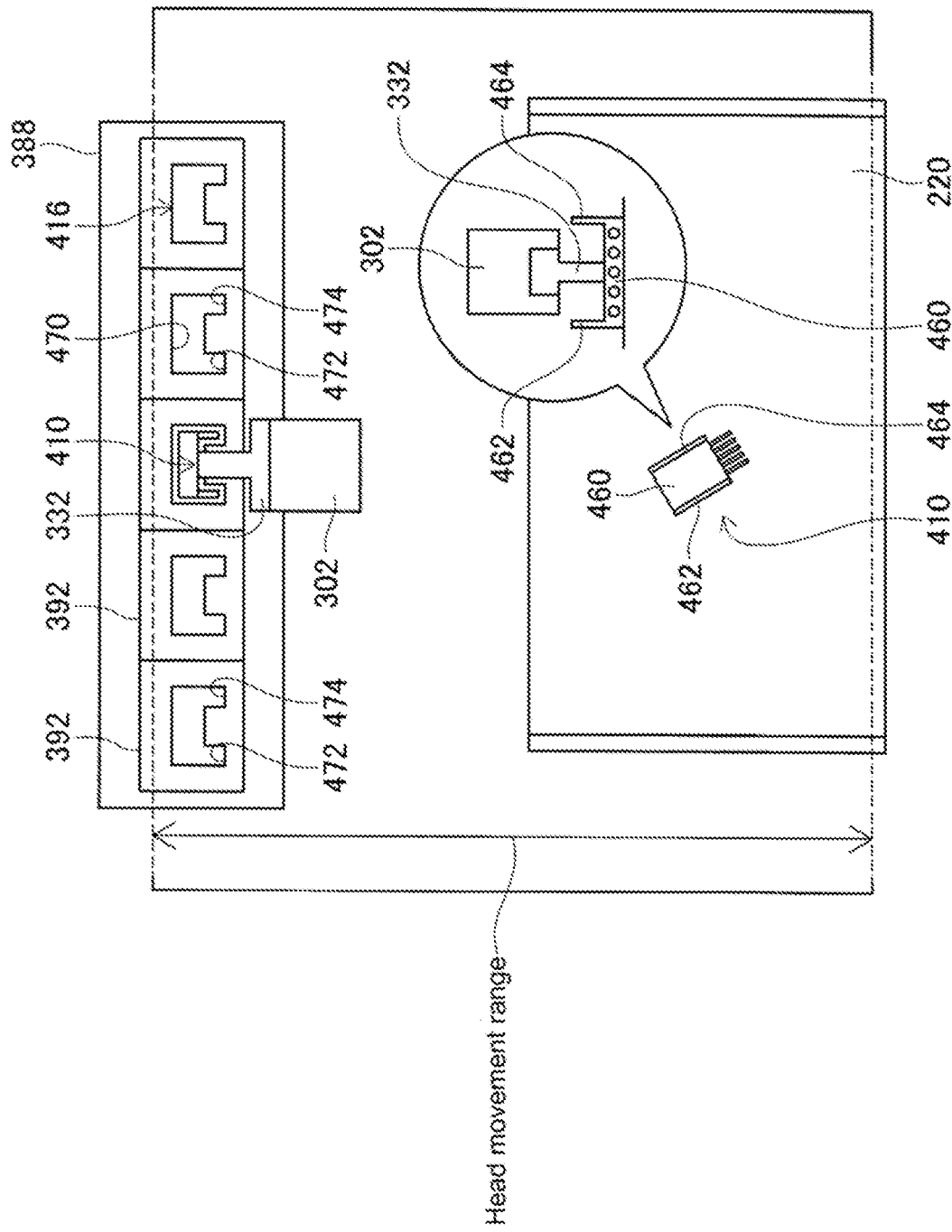
FIG. 13 is a diagram schematically illustrating a state in which a leaded component is transferred to the component receiving member of the related art.

As illustrated in FIG. 13, a detailed description will be given hereinafter of a case in which component receiving member 392 of the structure which is described above is set in component carrier 388 such that the pair of side wall section receiving recessed sections 472 and 474 are positioned on the component support member 220 side. First, the leaded component 410 which is supported by component support member 220 in the first posture is held by suction nozzle 332 in main body section 460 between the pair of side wall sections 462 and 464. Suction nozzle 332 is positioned at the non-pivoting position when suction nozzle 332 holds the leaded component 410.

When the leaded component 410 is held by suction nozzle 332, suction nozzle 332 moves from above component support member 220 to above component receiving member 392 through the operation of component holding head moving device 300. At this time, although suction nozzle 332 is pivoted to the pivoting position, it is necessary for suction nozzle 332 to move above component receiving member 392 such that the posture of the leaded component 410 which is held by suction nozzle 332 in the pivoting position matches the shape of component main body receiving recessed section 418 of component receiving member 392. In a case in which suction nozzle 332 moves in this manner, component holding head 302 to which suction nozzle 332 is mounted is positioned inside the movement range of component holding head 302 by component holding head moving device 300 as illustrated in FIG. 13. Therefore, it is possible to move suction nozzle 332 in this manner, and the leaded component 410 which is held by suction nozzle 332 is placed inside component receiving member 392 through the movement of suction nozzle 332.

Figure 14:
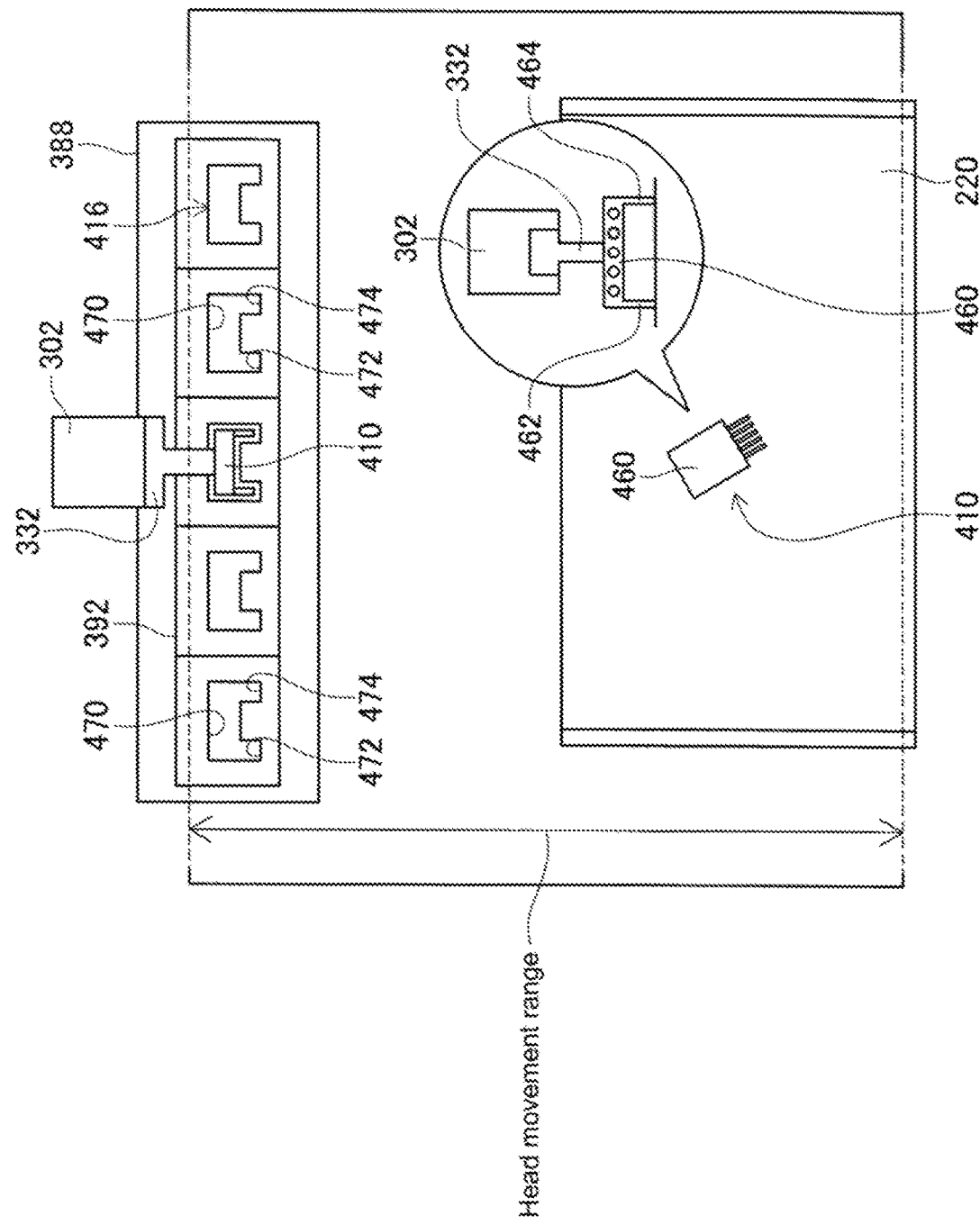
FIG. 14 is a diagram schematically illustrating a state in which the leaded component is transferred to the component receiving member of the related art.

Meanwhile, the leaded component 410 which is supported by component support member 220 in the second posture is held by suction nozzle 332 in main body section 460 in a state in which the pair of side wall sections 462 and 464 face downward as illustrated in FIG. 14. At this time, suction nozzle 332 is positioned at the non-pivoting position.

When the leaded component 410 is held by suction nozzle 332, suction nozzle 332 moves from above component support member 220 to above component receiving member 392 through the operation of component holding head moving device 300. At this time, although suction nozzle 332 is pivoted to the pivoting position, it is necessary for suction nozzle 332 to move above component receiving member 392 such that the posture of the leaded component 410 which is held by suction nozzle 332 in the pivoting position matches the shape of component main body receiving recessed section 418 of component receiving member 392. However, in order to move suction nozzle 332 in this manner, component holding head 302 to which suction nozzle 332 is mounted must be moved in excess of the movement range of component holding head 302 by component holding head moving device 300 as illustrated in FIG. 14. Therefore, it is not possible to move suction nozzle 332 in this manner, and it is not possible to place the leaded component 410 which is held by suction nozzle 332 in component receiving member 392. Therefore, in a case in which component receiving member 392 is set in component carrier 388, only the leaded components 410 of the first posture are transferred from component support member 220 to component receiving member 392 and leaded components 410 of the second posture remain on component support member 220.

However, when only the leaded components 410 of the first posture are transferred from component support member 220 to component receiving member 392 and the leaded components 410 of the second posture remain on component support member 220, the number of leaded components 410 which are transferred to component receiving member 392 is reduced, and the efficiency is extremely poor. In light of these facts, in bulk component supply device 32, a component receiving member on which components cans be placed is adopted not only for leaded components 410 of the first posture but also leaded components 410 of the second posture.

Figure 15:
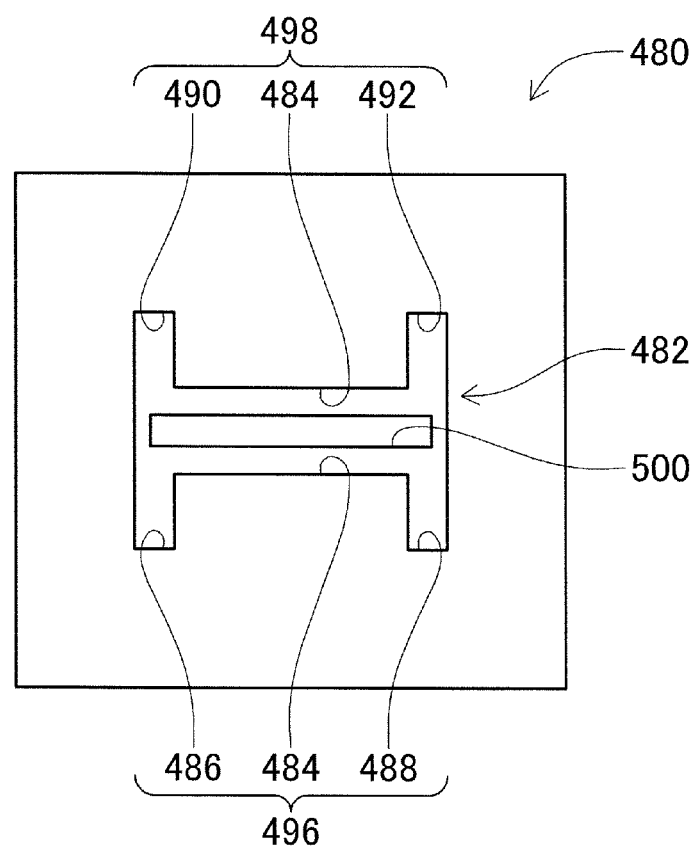
FIG. 15 is a plan view illustrating the component receiving member of the present disclosure.

Specifically, as illustrated in FIG. 15, a substantially H-shaped component main body receiving recessed section 482 is formed in component receiving member 480 which is adopted in bulk component supply device 32. Component main body receiving recessed section 482 is configured from main body section receiving recessed section 484, a pair of first side wall section receiving recessed sections 486 and 488, and a pair of second side wall section receiving recessed sections 490 and 492. Main body section receiving recessed section 484 is a shape corresponding to main body section 460 of component main body 412 of the leaded component 410 and is the same shape as main body section receiving recessed section 470 of component receiving member 392 of the related art.

The pair of first side wall section receiving recessed sections 486 and 488 are shapes corresponding to the pair of side wall sections 462 and 464 of component main body 412 of the leaded component 410 and are the same shapes as the pair of side wall section receiving recessed sections 472 and 474 of component receiving member 392 of the related art. The pair of first side wall section receiving recessed sections 486 and 488 extend in the same direction from both end portions of main body section receiving recessed section 484 to intersect with main body section receiving recessed section 484 at 90°.

Meanwhile, the pair of second side wall section receiving recessed sections 490 and 492 are shapes corresponding to the pair of side wall sections 462 and 464 of component main body 412 of the leaded component 410 and are the same shapes as the pair of side wall section receiving recessed sections 472 and 474 of component receiving member 392 of the related art. The pair of second side wall section receiving recessed sections 490 and 492 extend from both end portions of main body section receiving recessed section 484 to the opposite side from the pair of first side wall section receiving recessed sections 486 and 488 to intersect with main body section receiving recessed section 484 at 90°.

A first posture component main body receiving recessed section 496 which is configured by main body section receiving recessed section 484 and the pair of first side wall section receiving recessed sections 486 and 488 and a second posture component main body receiving recessed section 498 which is configured by main body section receiving recessed section 484 and the pair of second side wall section receiving recessed sections 490 and 492 are shaped corresponding to component main body 412 of the leaded component 410, and the first posture component main body receiving recessed section 496 and the second posture component main body receiving recessed section 498 are formed in component receiving member 480 in a state in which main body section receiving recessed section 484 overlaps. In other words, one of the first posture component main body receiving recessed section 496 and the second posture component main body receiving recessed section 498 is formed in component receiving member 480 in a state in which the other is rotated by 180° centered on the center of the other. Lead receiving recessed section 500 for inserting the leads 414 is formed in the bottom face of main body section receiving recessed section 484. The shape of lead receiving recessed section 500 is the same as the shape of lead receiving recessed section 420 of component receiving member 392.

Figure 16:
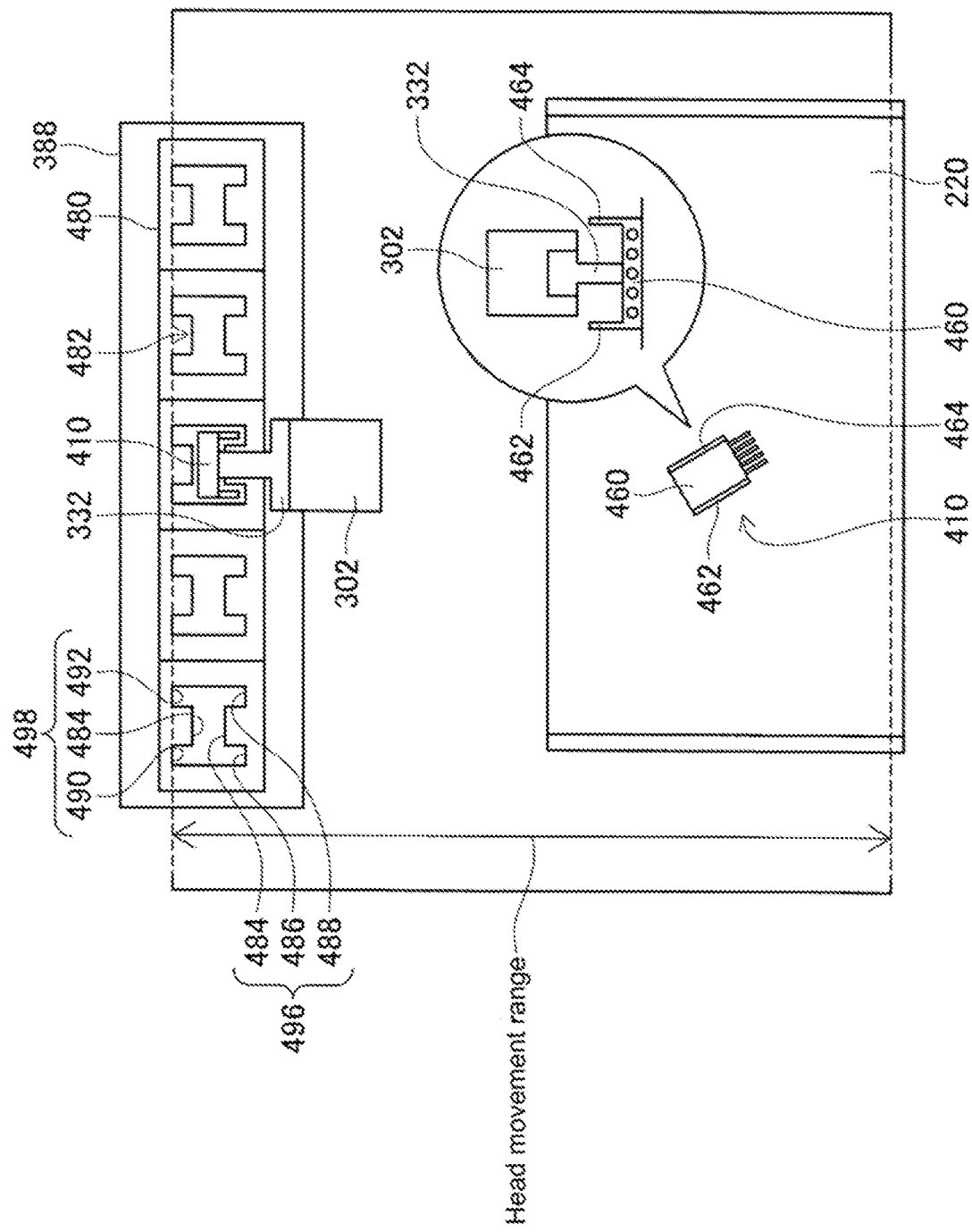
FIG. 16 is a diagram schematically illustrating a state in which the leaded component is transferred to the component receiving member of the present disclosure.

As illustrated in FIG. 16, a detailed description will be given hereinafter of a case in which component receiving member 480 of the structure which is described above is set in component carrier 388 such that the pair of first side wall section receiving recessed sections 486 and 488 are positioned on the component support member 220 side. First, the leaded component 410 which is supported by component support member 220 in the first posture is held by suction nozzle 332 in main body section 460 between the pair of side wall sections 462 and 464. At this time, suction nozzle 332 is positioned at the non-pivoting position.

When the leaded component 410 is held by suction nozzle 332, suction nozzle 332 moves from above component support member 220 to above component receiving member 480 through the operation of component holding head moving device 300. At this time, although suction nozzle 332 is pivoted to the pivoting position, suction nozzle 332 moves above component receiving member 480 such that the posture of the leaded component 410 which is held by suction nozzle 332 in the pivoting position matches the shape of the first posture component main body receiving recessed section 496 of component receiving member 480. In a case in which suction nozzle 332 moves in this manner, component holding head 302 to which suction nozzle 332 is mounted is positioned inside the movement range of component holding head 302 by component holding head moving device 300 as illustrated in FIG. 16. Therefore, it is possible to move suction nozzle 332 in this manner, and the leaded component 410 which is held by suction nozzle 332 is placed inside component receiving member 480 through the movement of suction nozzle 332.

Figure 17:
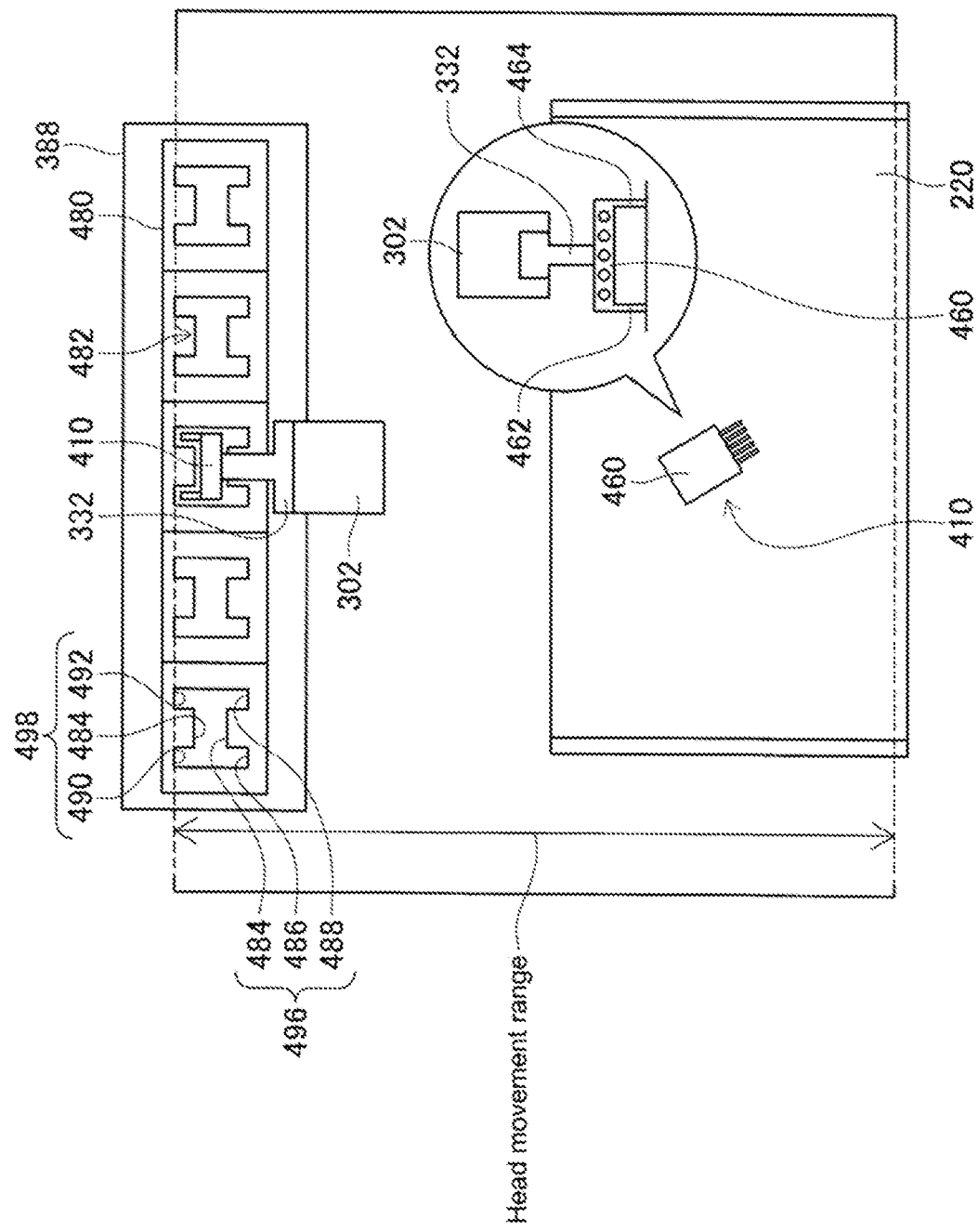
FIG. 17 is a diagram schematically illustrating a state in which the leaded component is transferred to the component receiving member of the present disclosure.

The leaded component 410 which is supported by component support member 220 in the second posture is held by suction nozzle 332 in main body section 460 in a state in which the pair of side wall sections 462 and 464 face downward as illustrated in FIG. 17. At this time, suction nozzle 332 is positioned at the non-pivoting position.

When the leaded component 410 is held by suction nozzle 332, suction nozzle 332 moves from above component support member 220 to above component receiving member 480 through the operation of component holding head moving device 300. At this time, although suction nozzle 332 is pivoted to the pivoting position, suction nozzle 332 moves above component receiving member 480 such that the posture of the leaded component 410 which is held by suction nozzle 332 in the pivoting position matches the shape of the second posture component main body receiving recessed section 498 of component receiving member 480. In a case in which suction nozzle 332 moves in this manner, component holding head 302 to which suction nozzle 332 is mounted is positioned inside the movement range of component holding head 302 by component holding head moving device 300 as illustrated in FIG. 17. Therefore, it is possible to move suction nozzle 332 in this manner, and the leaded component 410 which is held by suction nozzle 332 is placed inside component receiving member 480 through the movement of suction nozzle 332.

In this manner, by setting component receiving member 480 in component carrier 388, it becomes possible to move not only the leaded components 410 of the first posture, but also the leaded components 410 of the second posture from component support member 220 to component receiving member 480. Accordingly, it becomes possible to reduce the number of the leaded components 410 which remain on component support member 220 by a significant amount. In other words, it becomes possible to move many of the leaded components 410 from component support member 220 to component receiving member 480, and efficiency is improved.

When the leaded component 410 is placed in component receiving member 480, component carrier 388 moves to the component supply position through the operation of component carrier moving device 390. Since component carrier 388 which moves to the component supply position is positioned in the movement range of work heads 60 and 62, the leaded component 410 is supplied at this position in bulk component supply device 32. In this manner, in bulk component supply device 32, the leaded component 410 is supplied in a state in which the leads 414 face downward and the upper face which faces the bottom face to which the leads 414 are connected faces upward. Therefore, suction nozzles 66 of work heads 60 and 62 become capable of appropriately holding the leaded components 410.

In component mounting machine 10, information relating to the posture of the leaded component 410 which is placed in component receiving member 480 is transmitted from individual control device 452 of bulk component supply device 32 to individual control device 453 of component mounting device 24. In other words, when the leaded component 410 is transferred from on component support member 220 to component receiving member 480, information indicating which of the first posture component main body receiving recessed section 496 and the second posture component main body receiving recessed section 498 on which the leaded component 410 is placed is transmitted to individual control device 453 of component mounting device 24.

Accordingly, individual control device 453 of component mounting device 24 becomes capable of obtaining the information relating to the posture of the leaded component 410 which is placed in component receiving member 480 without performing imaging or the like of component receiving member 480 using imaging device 26. Individual control device 453 of component mounting device 24 becomes capable of holding the leaded component 410 inside component receiving member 480 and mounting the held leaded component 410 onto a board by controlling the operations of work heads 60 and 62 and work head moving device 64 based on the information relating to the posture of the leaded component 410 which is transmitted from individual control device 452 of bulk component supply device 32.

(b) Collection of Leaded Components

Figure 18:
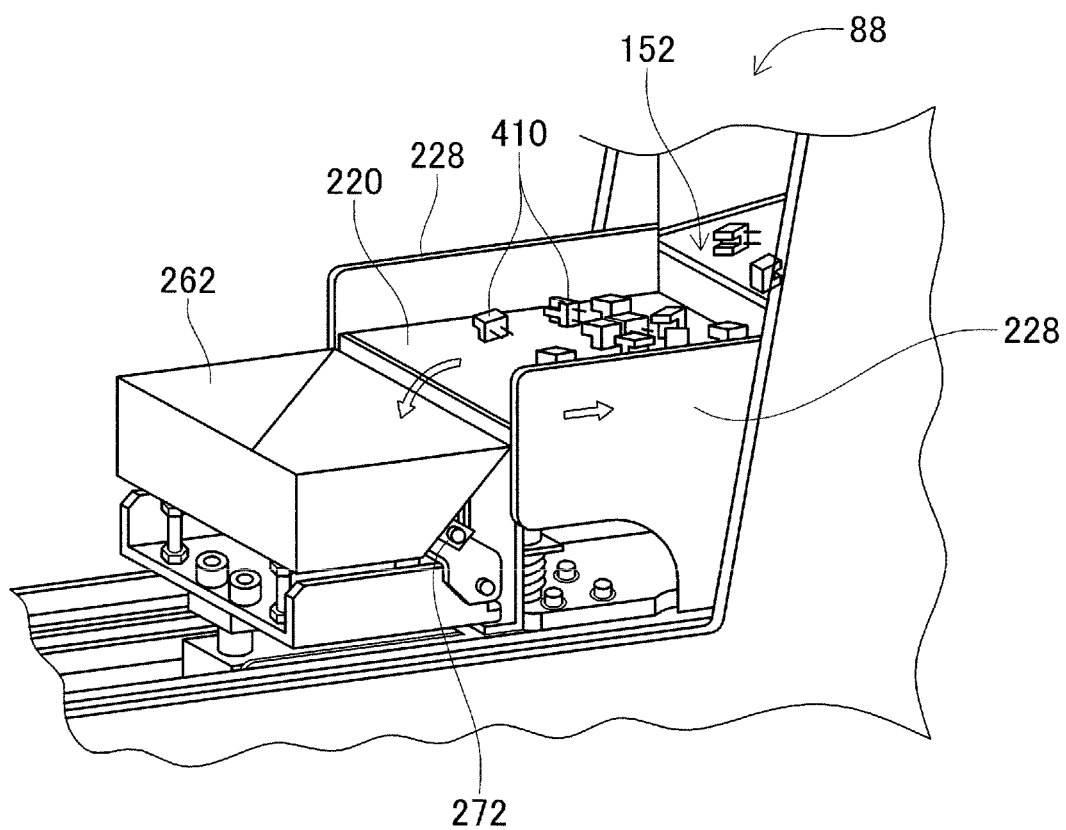
FIG. 18 is a perspective view illustrating the component scattering device and a component return device.

In bulk component supply device 32 it is possible to collect the leaded components 410 which are scattered on component support member 220. Specifically, component support member 220 is caused to move toward to the bottom of component feeder 88 through the operation of component support member moving device 222. At this time, as illustrated in FIG. 18, the leaded components 410 on component support member 220 are held back by inclined plate 152 of component feeder 88, and leaded components 410 on the component support member 220 are scraped into the inner portion of component collecting container 262.

Next, component collecting container 262 is lifted through operation of container lifting and lowering device 260. At this time, as illustrated in FIG. 5, protruding pin 272 which is arranged on component collecting container 262 engages with engaging block 274 which is arranged on the inside of side frame section 190. Therefore, component collecting container 262 rotates and the leaded components 410 inside component collecting container 262 are returned to the inner portion of component storage device 100.

As described above, in bulk component supply device 32, due to component receiving member 480 being set in component carrier 388, the leaded components 410 of the first posture and the leaded components 410 of the second posture are transferred from component support member 220 to component receiving member 480. Therefore, it becomes possible to reduce the number of the leaded components 410 which are returned to component storage device 100.

In other words, as described above, due to the operator gripping grip 104 of component feeder 88 such that locking of component feeder 88 is released and the operator lifting component feeder 88, component feeder 88 is removed from between the pair of side frame sections 190. Accordingly, the leaded components 410 are collected from component feeder 88 on the outside portion of bulk component supply device 32.

As illustrated in FIG. 8, individual control device 452 of bulk component supply device 32 includes first operation control section 510 and notification section 512. First operation control section 510 is a functional section for controlling operations of component holding head moving device 300 and component holding head 302 when the leaded components 410 are transferred from component support member 220 to component receiving member 480. Notification section 512 is a functional section for transmitting information relating to the postures of the leaded components 410 which are placed in component receiving member 480 to individual control device 453. Individual control device 453 of component mounting device 24 includes second operation control section 514. Second operation control section 514 is a functional section for using suction nozzle 66 to hold the leaded component 410 which is placed in component receiving member 480 and controlling operations of work heads 60 and 62 and work head moving device 64 to mount the held leaded component 410 on a board based on the information relating to the posture of the leaded component 410 which is transmitted from individual control device 452.

The present disclosure is not limited to the embodiment described above, and it is possible to carry out the present disclosure in various modes subjected to various modifications and improvements based on the knowledge of a person skilled in the art. Specifically, for example, in the embodiment described above, one of the first posture component main body receiving recessed section 496 and the second posture component main body receiving recessed section 498 is formed in component receiving member 480 in a state rotated by 180° centered on the center of the other; however, the rotation angle is not limited to 180°, and may be set to any angle such as 45° or 90°.

Figure 19:
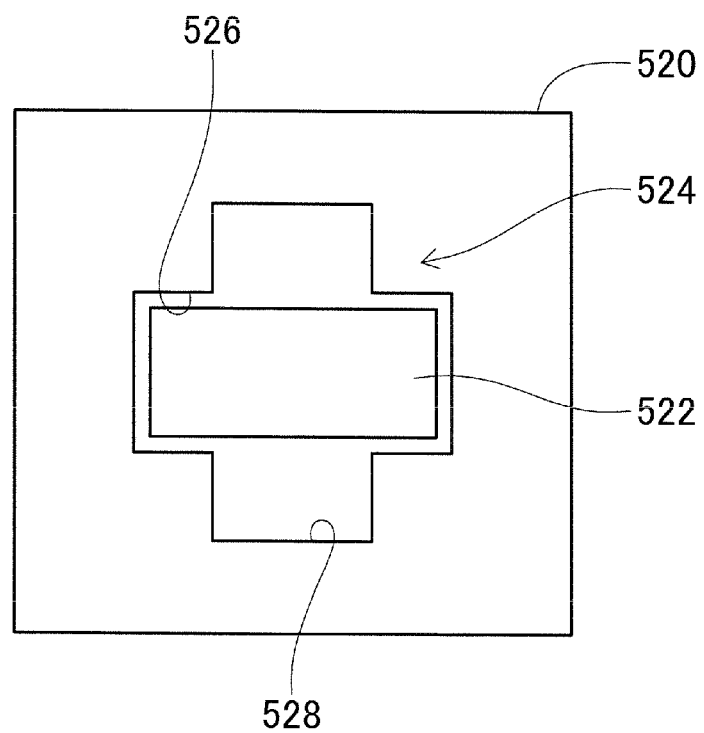
FIG. 19 is a plan view illustrating the component receiving member of an alternative embodiment.

In the example described above, leaded components 410 are adopted as components which are supplied by bulk component supply device 32; however, it is possible to adopt constituent components of a solar cell, constituent components of a power module, electronic circuit components which do not have leads, or the like. In a case in which electronic circuit components which do not have leads are supplied by bulk component supply device 32, it is possible to set component receiving member 520 depicted in FIG. 19 in component carrier 388.

Electronic circuit components 522 which do not have leads are placed on component receiving member 520, and component receiving recessed section 524 is formed in component receiving member 520. Component receiving recessed section 524 is substantially cross-shaped and is configured by a first posture component receiving recessed section 526 and a second posture component receiving recessed section 528. The first posture component receiving recessed section 526 and the second posture component receiving recessed section 528 are shapes corresponding to electronic circuit component 522 and have the same shape. One of the first posture component receiving recessed section 526 and the second posture component receiving recessed section 528 is formed in component receiving member 520 in a state rotated by 90° centered on the center of the other. If the component receiving member 520 of this shape is adopted, it is possible to place electronic circuit component 522 in either the first posture component receiving recessed section 526 or the second posture component receiving recessed section 528 and it is possible to obtain the same effect as in the example described above.

REFERENCE SIGNS LIST

10: component mounting machine (mounting machine), 32: bulk component supply device (component supply device), 64: work head moving device (second moving device), 66: suction nozzle (second component holding tool), 220: component support member (component support section), 300: component holding head moving device (first moving device), 332: suction nozzle (first component holding tool), 452: individual control device (first control device), 453: individual control device (second control device), 480: component receiving member (placement section), 496: first posture component main body receiving recessed section (first recessed section), 498: second posture component main body receiving recessed section (second recessed section), 510: first operation control section, 512: notification section, 514: second operation control section, 520: component receiving member (placement section), 526: first posture component receiving recessed section (first recessed section), 528: second posture component receiving recessed section (second recessed section).

The invention claimed is:

1. A component supply device comprising:
   a component support which supports multiple components in a scattered state;
   a first component holding tool which holds a component of the multiple components which are supported by the component support;
   a first moving device which includes a motor and which moves the first component holding tool; and
   a placement section on which the components are placed in a lined up state by the first component holding tool moved by the first moving device,
   wherein the placement section includes
      a first recessed section corresponding to a shape of the components, and
      a second recessed section which having a same shape as the first recessed section rotated by a predetermined angle and which overlaps a portion of the first recessed section, and
   wherein the first component holding tool is configured to place the components in both the first recessed section and the second recessed section.

2. The component supply device according to claim 1, wherein the predetermined angle is at least one angle of 90° and 180°.

3. The component supply device according to claim 1, wherein the first component holding tool supports the component in at least one of a first posture and a second posture.

4. The component supply device according to claim 3, wherein the first component holding tool is configured to hold the component in the first posture to match a shape of the first recessed section and configured to hold the component in the second posture to match a shape of the second recessed section.

* * * * *